(12) United States Patent
Tamrazyan et al.

(10) Patent No.: US 11,949,423 B2
(45) Date of Patent: Apr. 2, 2024

(54) CLOCK AND DATA RECOVERY DEVICE WITH PULSE FILTER AND OPERATION METHOD THEREOF

(71) Applicant: Faraday Technology Corp., Hsinchu (TW)

(72) Inventors: Mikhail Tamrazyan, Hsinchu (TW); Vinod Kumar Jain, Hsinchu (TW); Prateek Kumar Goyal, Hsinchu (TW)

(73) Assignee: Faraday Technology Corp., Hsinchu (TW)

(*) Notice: Subject to any disclaimer, the term of this patent is extended or adjusted under 35 U.S.C. 154(b) by 28 days.

(21) Appl. No.: 17/846,018

(22) Filed: Jun. 22, 2022

(65) Prior Publication Data
US 2023/0421158 A1 Dec. 28, 2023

(51) Int. Cl.
*H03L 7/18* (2006.01)
*H03L 7/08* (2006.01)
(Continued)

(52) U.S. Cl.
CPC ............ *H03L 7/0807* (2013.01); *H03L 7/087* (2013.01); *H03L 7/099* (2013.01); *H04L 7/0016* (2013.01)

(58) Field of Classification Search
CPC ..... H04L 7/033; H04L 7/0337; H04L 7/0331; H04L 7/0025; H04L 7/0087; H04L 7/0008; H04L 25/03057; H04L 7/0004; H04B 10/40; H04B 10/25; H04B 10/50; H04B 1/40; H04B 10/69; H04B 10/2914; H04B 1/16; H04B 10/0795; H04B 10/503; H04J 14/02; H04J 14/0221; H04J 14/08; H04J 3/0641; H04J 14/0278; H04J 3/0667; H04J 3/0685; H04J 14/06; H04J 14/0202
(Continued)

(56) References Cited

U.S. PATENT DOCUMENTS 8,030,964 B1 * 10/2011 Shih ............... H03K 19/018521
326/68
8,718,217 B2 5/2014 Walker et al.
(Continued)

FOREIGN PATENT DOCUMENTS

CN 113783568 12/2021
WO 2018189288 10/2018

OTHER PUBLICATIONS

"Office Action of Taiwan Counterpart Application", dated Sep. 20, 2023, p. 1-p. 7.

*Primary Examiner* — Eva Y Puente
(74) *Attorney, Agent, or Firm* — JCIPRNET (57) ABSTRACT

A clock and data recovery device that includes a first phase detector, a pulse filter, a charge pump, a loop filter and a voltage-controlled oscillator is introduced. The first phase detector generates a first phase state signal according to a data signal and a first output signal. The pulse filter adjusts the first phase state signal according to a capacitance of a loop capacitor to generate a filtered signal. The charge pump generates a pumping signal according to the filtered signal. The loop filter generates a control signal according to the pumping signal. The voltage-controlled oscillator generates a second output signal and adjust a frequency of the second output signal according to the control signal, wherein the first output signal is generated according to the second output signal.

19 Claims, 7 Drawing Sheets

(51) Int. Cl.
*H03L 7/087* (2006.01)
*H03L 7/099* (2006.01)
*H04L 7/00* (2006.01)

(58) Field of Classification Search
USPC .......................................................... 375/355
See application file for complete search history.

(56) References Cited

U.S. PATENT DOCUMENTS

| | | |
|---|---|---|
| 9,219,599 B2 | 12/2015 | Wang et al. |
| 10,097,341 B1 * | 10/2018 | Ribo ..................... H04L 7/0079 |
| 10,411,593 B1 * | 9/2019 | Abramzon ............. H03K 21/08 |
| 10,541,691 B1 * | 1/2020 | Kossel ................... H03L 7/085 |
| 11,398,825 B1 * | 7/2022 | Eimitsu ................ H03L 7/0807 |
| 2003/0085743 A1 | 5/2003 | Ullmann et al. |
| 2007/0002993 A1 * | 1/2007 | Wang ..................... H03L 7/087 |
| | | 375/376 |
| 2008/0068090 A1 | 3/2008 | Watanabe |
| 2014/0301515 A1 * | 10/2014 | Iravani ................. H03L 7/0893 |
| | | 375/371 |
| 2018/0191358 A1 * | 7/2018 | Wang ..................... H04L 7/033 |

\* cited by examiner

CLOCK AND DATA RECOVERY DEVICE WITH PULSE FILTER AND OPERATION METHOD THEREOF

BACKGROUND

Technical Field

The disclosure generally relates to a clock and data recovery device, and more particularly to a clock and data recovery circuit with a pulse filter and an operation method thereof.

Description of Related Art

In many high-speed systems, a transmission of data is performed via high-speed serial links without accompanying a clock, and a clock and data recovery (CDR) device is utilized to proceed data synchronously. The CDR device may recover the clock information from input data, and the recovered clock information is used to sample and retime the data for further processing. An analog CDR device has advantages of high bandwidth with adequate phase margin and low latency over a digital CDR device. However, the analog CDR device requires large-in-size loop capacitors with large capacitance to remain stability and performance of the analog CDR device. The large-in-size loop capacitors with large capacitance occupies a large area in a circuit board It is desired for a creative design of the CDR device that may reduce occupied area while maintaining stability and performance of the CDR device. Nothing herein should be construed as an admission of knowledge in the prior art of any portion of the present disclosure.

SUMMARY

The disclosure introduces a clock and data recovery (CDR) device and an operation method thereof.

In some embodiments, the CDR device includes a first phase detector, a pulse filter, a charge pump, a loop filter and a voltage-controlled oscillator. The first phase detector may receive a data signal and a first output signal and generate a first phase state signal according to the data signal and the first output signal. The pulse filter is coupled to the first phase detector and is configured to adjust the first phase state signal according to a capacitance of a loop capacitor to generate a filtered signal. The charge pump is coupled to the phase detector and is configured to generate a pumping signal according to the filtered signal. The loop filter includes the loop capacitor and is configured to generate a control signal according to the pumping signal. The voltage-controlled oscillator is configured to generate a second output signal and adjust a frequency of the second output signal according to the control signal, wherein the first output signal is generated according to the second output signal.

In some embodiments, the CDR device includes a first phase detector, a pulse filter, a second phase detector, a first multiplexer, a second multiplexer, a charge pump, a loop filter and a voltage-controlled oscillator. The first phase detector receives a data signal and a first output signal and generates a first phase state signal according to the data signal and the first output signal. The pulse filter is coupled to the first phase detector, and is configured to adjust the first phase state signal according to a capacitance of a loop capacitor to generate a filtered signal. The second phase detector receives a reference clock signal and generates a second phase state signal according to the reference clock signal. The first multiplexer is coupled to the second phase detector and the pulse filter, and is configured to selectively connect the second phase detector or the pulse filter to the charge pump according to a lock signal. The charge pump is coupled to the first multiplexer and is configured to generate a pumping signal according to the second signal or the third pulse signal. The loop filter includes the loop capacitor and is configured to generate a control signal according to the pumping signal. The second multiplexer is coupled to the first phase detector, the second phase detector and the voltage-controlled oscillator, and the second multiplexer is configured to selectively connect the first phase detector or the second phase detector to the voltage-controlled oscillator according to the lock signal. The voltage-controlled oscillator is configured to generate a second output signal and adjust a frequency of the second output signal according to the control signal, wherein the first output signal is generated according to the second output signal.

In some embodiments, the operation method of the CDR device includes steps of receiving, by a first phase detector of the clock and data recovery device, a data signal and a first output signal; generating, by the first phase detector, a first phase state signal according to the data signal and the first output signal; adjusting, by a pulse filter of the clock and data recovery device, the first phase state signal according to a capacitance of a loop capacitor to generate a filtered signal; generating, by a charge pump of the clock and data recovery device, a pumping signal according to the filtered signal; generating, by loop filter of the clock and data recovery device, a control signal according to the pumping signal; and generating, by a voltage-controlled oscillator of the clock and data recovery device, a second output signal and adjusting a frequency of the second output signal according to the control signal, wherein the first output signal is generated according to the second output signal.

In some embodiments, a pulse filter of a CDR device is configured to adjust a pulse width of a first phase state signal according to a capacitance of a loop capacitor to generate a filtered signal. Since charging time or discharging time of the loop capacitor depends on the pulse width of the filtered signal, the charging time or the discharging time of the loop capacitor may be adjusted according to the capacitance of the loop capacitor. In this way, the size of the loop filter may be reduced without degrading performance and stability of the CDR device. The circuit structure of the pulse filter is relatively simple and does not occupy much area in a circuit board. In addition, the circuit structure of the pulse filter is scalable, thus the pulse filter may be applicable to a wide range of applications.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1:
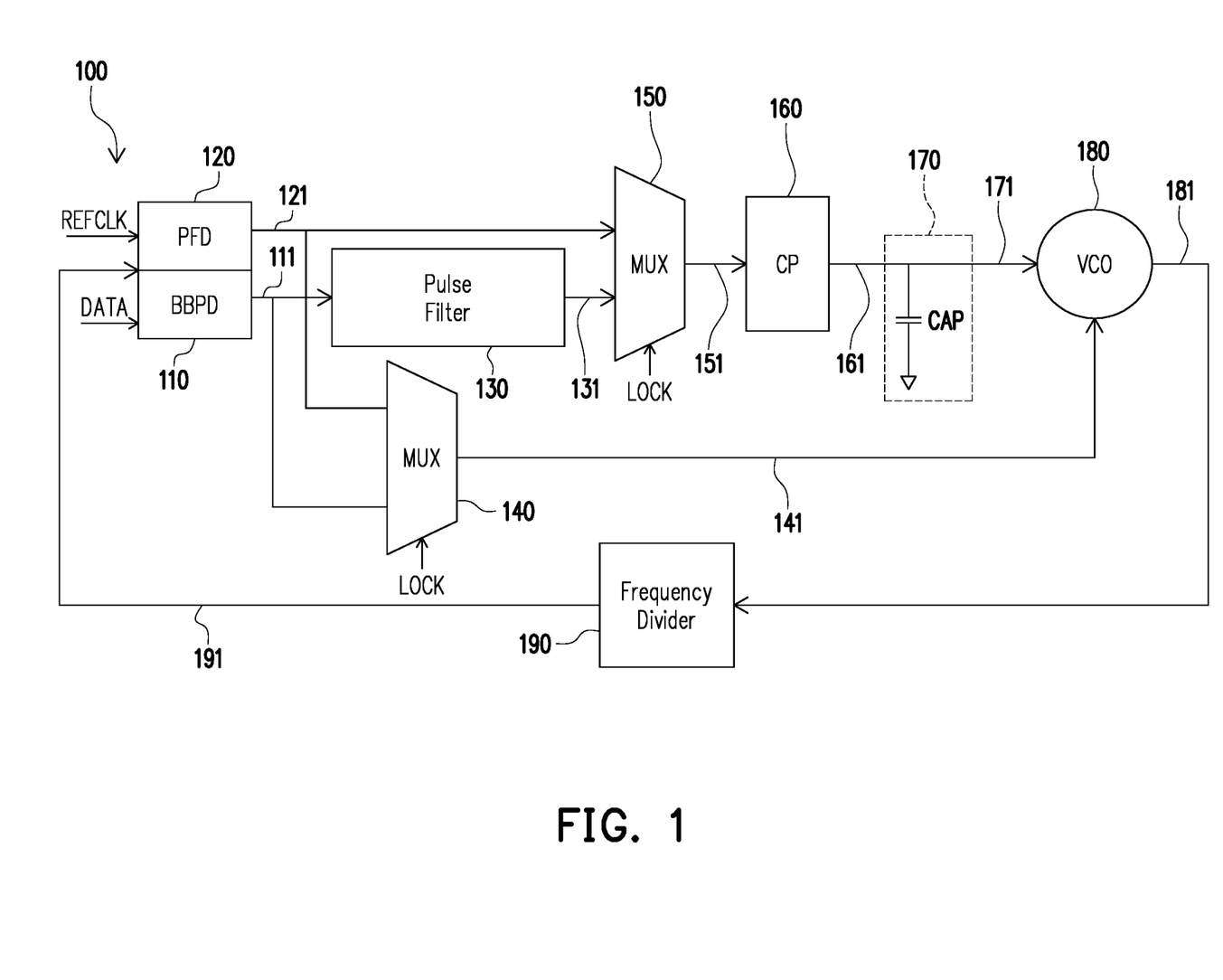
FIG. 1 illustrates a schematic diagram of a clock and data recovery (CDR) device in accordance with some embodiments.

FIG. 1 illustrates a schematic diagram of a clock and data recovery (CDR) device 100 in accordance with some embodiments. The CDR device 100 may include a bang-bang phase detector (BBPD) 110 (also referred to as a first phase detector), a linear phase frequency detector (PFD) 120 (also referred to as a second phase detector), a pulse filter 130, multiplexers 140, 150, a charge pump 160, a loop filter 170, a voltage-controlled oscillator 180 and a frequency divider 190.

The PFD 120 may receive a reference clock signal REFCLK and a first output signal 191, compare the reference clock signal REFCLK and the first output signal 191, and generate a phase state signal 121 based on the comparison of the reference clock signal REFCLK with the first output signal 191. The phase state signal 121 may represent a first phase state DN or a second phase state UP for indicating a phase leading state or a phase lagging state of the first output signal 191 relative to the phase of the reference clock signal REFCLK. The PFD 120 may output the phase state signal 121 to the multiplexers 140 and 150.

The BBPD 110 may receive a data signal DATA and the first output signal 191, compare the data signal DATA and the first output signal 191, and generate a phase state signal 111 based on the comparison of the data signal DATA with the first output signal 191. The phase state signal 111 may represent the first phase state DN or the second phase state UP for indicating the phase leading state or the phase lagging state of the data signal DATA relative to the first output signal 191. The BBPD 110 may output the phase state signal 111 to the pulse filter 130 and the multiplexer 140.

In some embodiments, the CDR device 100 may operate in first operational mode (also referred to as an initial mode) or a second operational mode (also referred to as a main operational mode). In the first operational mode, the CDR device 100 may acquire a target frequency (not shown) and the reference clock signal REFCLK. The CDR device 100 is configured to align a frequency of a second output signal 181 with the frequency of the target frequency in the first operational mode. The CDR device 100 may have a function of a phase lock loop (PLL) circuit that is configured to adjust the frequency of the second output signal 181 until the frequency of the second output signal 181 align with the frequency of the target frequency. In other words, the CDR device 100 may lock the frequency of the second output signal 181 to the frequency of the target frequency. When the frequency of the second output signal 181 is locked to the frequency of the target frequency, the CDR device 100 is switched from the first operational mode to the second operational mode. Meanwhile, a lock signal LOCK is asserted to the multiplexers 140 and 150. In the second operational mode, the PFD 120 is disabled and the BBPD 110 is enabled to compare the data signal DATA with the first output signal 191 to generate the phase state signal 111.

In some embodiments, the pulse filter 130 is coupled to the BBPD 110 and is configured to adjust the phase state signal 111 according to a capacitance of a loop capacitor CAP of the loop filter 170 to generate a filtered signal 131. The phase state signal 111 may include at least one pulse, and the pulse filter 130 is configured to adjust a pulse width of the at least one pulse of the phase state signal 111 according to the capacitance of the loop capacitor CAP to generate the filtered signal 131. Since charging time or discharging time of the loop capacitor CAP depends on the pulse width of the phase state signal 111, the charging time or discharging time of the loop capacitor CAP may be adjusted according to the capacitance of the loop capacitor CAP. As such, even when capacitance of the loop capacitor CAP is reduced, the pulse filter 130 may adjust the phase state signal 111 such that the stability and the performance of the CDR device 100 are remained. In this way, the size of the loop filter 170 may be reduced without degrading stability and performance of the CDR device 100.

In some embodiments, the multiplexer 140 includes a first input terminal being coupled to the PFD 120, a second input terminal being coupled to the BBPD 110, and an output terminal being coupled to the voltage-controlled oscillator 180. The multiplexer 140 may selectively couple the PFD 120 or the BBPD 110 to the voltage-controlled oscillator 180 based on the lock signal LOCK. In other words, the multiplexer 140 may select the phase state signal 121 or the phase state signal 111 to be a signal 141 based on the lock signal LOCK. In some embodiments, the multiplexer 140 selects the phase state signal 121 as the signal 141 when the lock signal LOCK is not asserted to the multiplexer 140, and the multiplexer 140 selects the phase state signal 111 as the signal 141 when the lock signal LOCK is asserted to the multiplexer 140. The multiplexer 140 may output the signal 141 to the voltage-controlled oscillator 180.

The multiplexer 150 may include a first input terminal being coupled to the PFD 120, a second input terminal being coupled to the pulse filter 130, and an output terminal being coupled to the charge pump 160. The multiplexer 150 may selectively couple the PFD 120 or the pulse filter 130 to the charge pump 160 based on the lock signal LOCK. In other words, the multiplexer 150 may select the phase state signal 121 or the filtered signal 131 to be a signal 151 based on the lock signal LOCK. In some embodiments, the multiplexer 150 selects the phase state signal 121 as the signal 151 when the lock signal LOCK is not asserted to the multiplexer 150, and the multiplexer 150 selects the filtered signal 131 as the signal 151 when the lock signal LOCK is asserted to the multiplexer 150. In the first operational mode, the signal 151 may represent the phase leading state or the phase lagging state of the first output signal 191 relative to the reference clock signal REFCLK. In the second operation mode, the signal 151 may represent the phase leading state or the phase lagging state of the data signal DATA relative to the first output signal 191. The multiplexer 150 may output the signal 151 to the charge pump 160.

The charge pump 160 is coupled to the multiplexer 150 and is configured to generate a pumping signal 161 based on the signal 151. The loop filter 170 is coupled to the charge pump 160 and is configured to generate the control signal 171 based on the pumping signal 161. The control signal 171 may be a control voltage that is used to control the voltage-controlled oscillator 180. In some embodiments, when the signal 151 represents the first phase state DN, a discharging operation is performed to discharge the loop capacitor CAP of the loop filter 170. The discharging operation may be performed during a discharging period, and a length of the discharging period depends on the pulse width of the signal 151. When the signal 151 represents the second phase state UP, a charging operation is performed to charge the loop capacitor CAP of the loop filter 170. The charging operation may be performed during a charging period, and a length of the charging period depends on the pulse width of the signal 151. The voltage level of the control signal 171 may be adjusted by the charging or discharging operation performed on the loop capacitor CAP. The loop filter 170 may output the control signal 171 to the voltage-controlled oscillator 180.

The voltage-controlled oscillator 180 is coupled to the loop filer 170 and the multiplexer 140, and the voltage-controlled oscillator 180 is configured to generate the second output signal 181 based on the control signal 171 and the signal 141. In some embodiments, the voltage-controlled oscillator 180 is configured to adjust the frequency of the second output signal 181 based on the control signal 171. For example, the frequency of the second output signal is increased when the voltage level of the control signal 171 is increased, and the frequency of the second output signal decreased when the voltage level of the control signal 171 is decreased. The frequency divider 190 is coupled to the voltage-controlled oscillator 180 and is configured to divide the frequency of the second output signal 181 by a non-zero integer N to generate the first output signal 191. For example, the frequency of the first output signal 191 is f/N when the frequency of the second output signal 181 is f. The frequency divider 190 outputs the first output signal 191 to the PFD 120 or the BBPD 110.

In some embodiments, the CDR device 100 may be divided into a proportional path and an integral path. The proportional path is from the PFD 120 and the BBPD 110 through the multiplexer 140 to the voltage-controlled oscillator 180. The integral path is from the PFD 120 and the BBPD 110 through the pulse filter 130, the multiplexer 150, the charge pump 160 and the loop filter 170 to the voltage-controlled oscillator 180.

Figure 2:
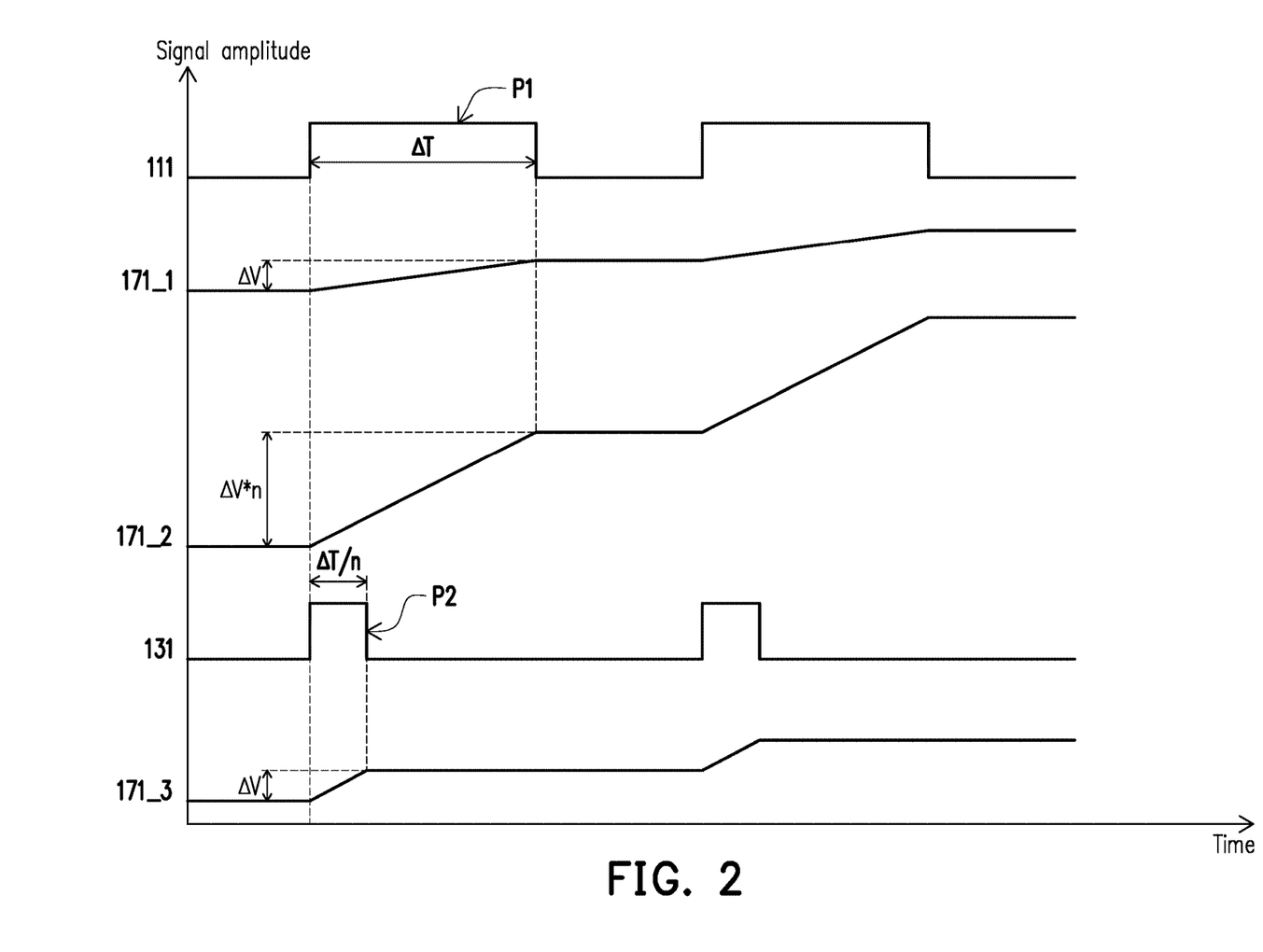
FIG. 2 illustrates a waveform diagram of signals of the CDR device in accordance with some embodiments.

FIG. 2 illustrates a waveform diagram of the phase state signal 111, the filtered signal 131, and control signals 171_1, 171_2 and 171_3. The control signal 171_1 is generated based on the phase state signal 111 when the loop capacitor CAP has a first capacitance (i.e., C). The control signal 171_2 is generated based on the phase state signal 111 when the loop capacitor CAP has a second capacitance (i.e., C/n, where n is a positive integer). The control signal 171_3 is generated based on the phase state signal 131 when the loop capacitor CAP has the second capacitance (i.e., C/n).

Referring to FIG. 1 and FIG. 2, the phase state signal 111 may include a pulse P1 with a pulse width of ΔT. When the loop capacitor CAP has the first capacitance C and the phase state signal 111 is used to generate the control signal 171_1, a charging operation may be performed on the loop capacitor CAP during the pulse width ΔT to adjust the control signal 171_1 by an adjustment amount of ΔV1. The adjustment amount ΔV1 may be calculated according to the equation (1), in which I is a current flowing through the loop capacitor CAP, C is the capacitance of the capacitor CAP, and ΔT is the pulse width of a pulse of the phase state signal 111.

$$\Delta V1 = \frac{I \times \Delta T}{C} \qquad (1)$$

When the loop capacitor CAP has the second capacitance C/n and the phase state signal 111 is used to generate the control signal 171_2, a charging operation may be performed on the loop capacitor CAP during the pulse width ΔT to adjust the control signal 171_2 by an adjustment amount of ΔV2. The adjustment amount ΔV2 may be calculated according to the equation (2), in which I is the current flowing through the loop capacitor CAP, C/n is the capacitance of the capacitor CAP, and ΔT is the pulse width of a pulse of the phase state signal 111.

$$\Delta V2 = \frac{I * \Delta T}{C/n} \qquad (2)$$

Referring to the equation (1) and (2), when the capacitance of the loop capacitor CAP is reduced by n times from C to C/n, the adjustment amount ΔV2 in equation (2) is n times higher the adjustment amount ΔV1 in equation (1). As a result of the reduction of the capacitance of the loop capacitor CAP, the stability of the CDR 100 may be degraded.

Referring to FIG. 2, the filtered signal 131 may include a pulse P2 with a pulse width of ΔT/n. When the loop capacitor CAP has the second capacitance C/n and the filtered signal 131 is used to generate the control signal 171_3, a charging operation may be performed on the loop capacitor CAP during the pulse width ΔT/n to adjust the control signal 171_3 by an adjustment amount of ΔV3. The adjustment amount ΔV3 may be calculated according to the equation (3), in which I is the current flowing through the loop capacitor CAP, C/n is the capacitance of the capacitor CAP, and ATM is the pulse width of a pulse of the filtered signal 131.

$$\Delta V3 = \frac{I * \left(\frac{\Delta T}{n}\right)}{\frac{C}{n}} = \frac{I \times \Delta T}{C} \qquad (3)$$

Referring to the equations (1) and (3), the adjustment amount ΔV3 in equation (3) is equal to the adjustment amount ΔV1 in equation (1). In this way, the capacitance of the loop capacitor CAP may be reduced by n times without degrading the stability of the CDR device 100. Since the occupied area of the loop capacitor CAP in the circuit board of the CDR device 100 is relatively large, the capability of reducing the capacitance of the loop capacitor CAP may significantly reduce size of the loop filter 170. FIG. 2 illustrates the waveform of the phase state signal 111 that represents the second phase state UP. The waveform of the phase state signal 111 that represents the first phase state DN should be explained in an analogous manner.

Figure 3A:
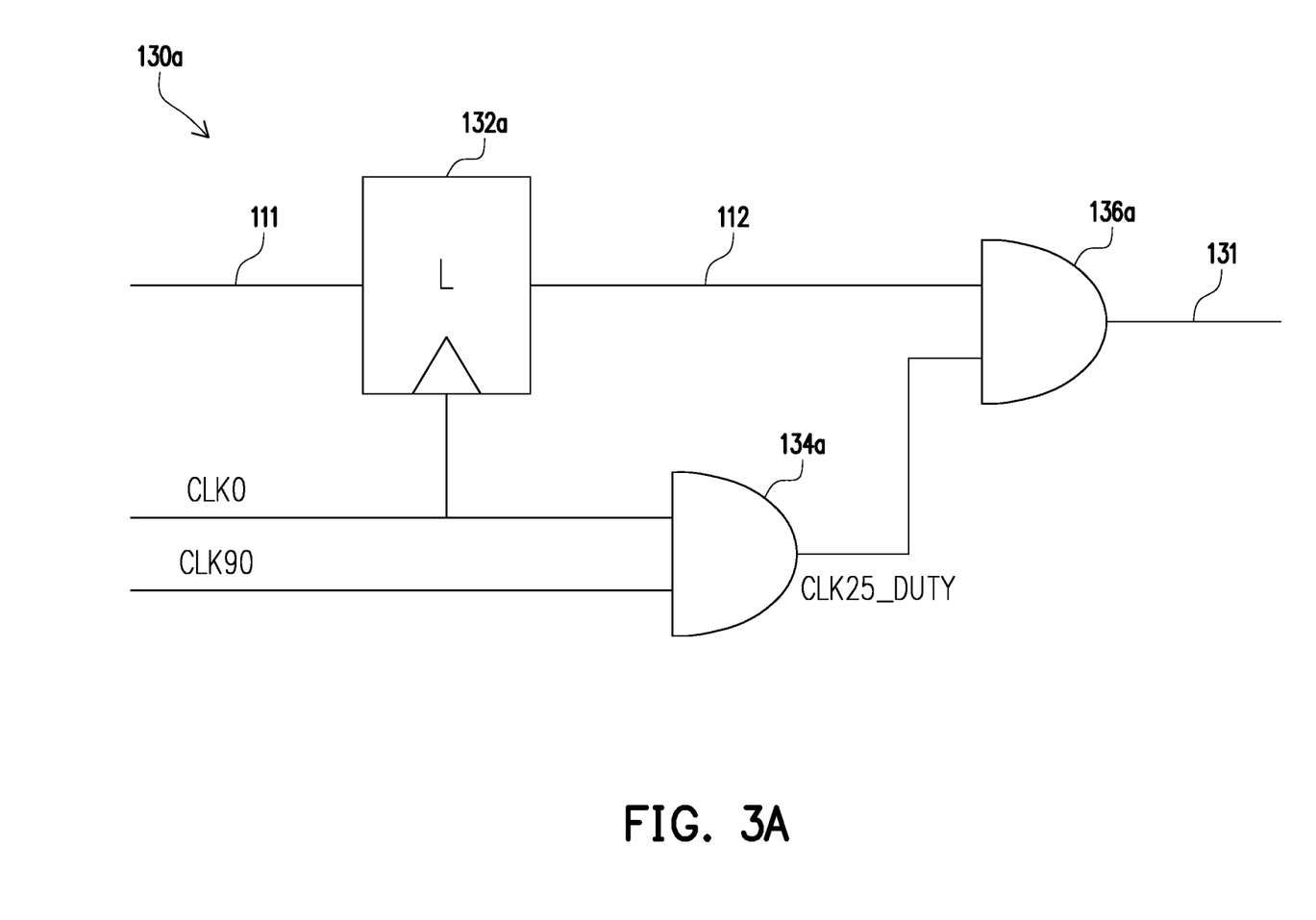
FIG. 3A illustrates a schematic diagram of a pulse filter of a CDR device in accordance with some embodiments.

FIG. 3A illustrates a schematic diagram of a pulse filter 130a of a CDR device in accordance with some embodiments. The pulse filter 130a in FIG. 3A may be same as the pulse filter 130 of the CDR device 100 in FIG. 1. In some embodiments, the pulse filter 130a includes a latch circuit 132a, a first logic circuit 134a and a second logic circuit 136a. The latch circuit 132a may receive the phase state signal 111 and a clock signal CLK0 and the latch circuit 132a is configured to latch the phase state signal 111 according to the clock signal CLK0 to generate a latch signal 112. The latch circuit 132a may be a rising edge triggered latch circuit or a falling edge triggered latch circuit.

The first logic circuit 134a receives the clock signal CLK0 and a clock signal CLK90 and is configured to perform a first logic operation on the clock signals CLK0 and CLK90 to generate a clock signal CLK25_DUTY. In some embodiments, the clock signals CLK0 and CLK90 have same frequency, and phase of the clock signal CLK25_DUTY is different from a phase of the clock signal CLK0. For example, a phase shift between the clock signal CLK0 and the clock signal CLK90 is 90 degrees. The clock signals CLK0 and CLK90 may be generated by the voltage-controlled oscillator 180, but the disclosure is not limited thereto.

The second logic circuit 136a is coupled to the latch circuit 132a and the first logic circuit 134a, and the second logic circuit 136a is configured to perform a second logic operation on the latch signal 112 and the clock signal CLK25_DUTY to generate the filtered signal 131. In some embodiments, the first logic circuit 134a and the second logic circuit 136a are AND logic gates, and the first and second logic operations are AND operations.

Figure 3B:
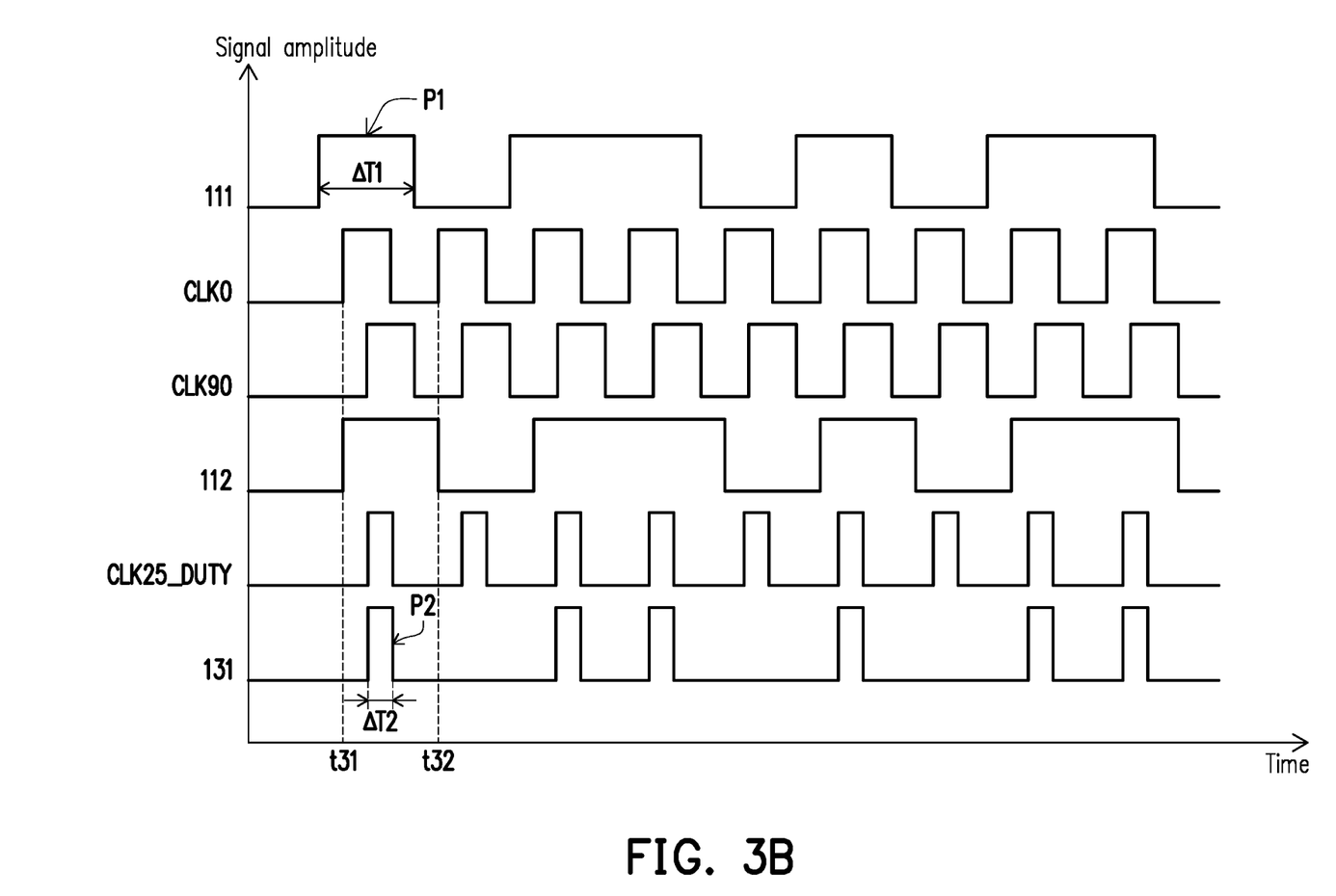
FIG. 3B illustrates a waveform diagram of signals of the pulse filter of the CDR device in accordance with some embodiments.

FIG. 3B illustrates a waveform diagram of the phase state signal 111, the latch signal 112, the filtered signal 131, and clock signals CLK0, CLK90 and CLK25_DUTY of the pulse filter 130a in FIG. 3A in accordance with some embodiments. Referring to FIG. 3A and FIG. 3B, the phase state signal 111 may include a pulse P1 with a pulse width of ΔT1. The latch circuit 132a may be triggered by rising edges of the clock signal CLK0. For example, at the rising edge of the clock signal CLK0 corresponding to t31, the logic state of the phase state signal 111 at t31 is a high logic state (i.e., logic state of "1"), and the latch circuit 132a outputs the latch signal 112 with a rising edge at t31. At the rising edge of the clock signal CLK0 corresponding to t32, the logic state of the phase state signal 111 at t32 is a low logic state (i.e., logic state of "0"), and the latch circuit 132a outputs the latch signal 112 with a falling edge at t32.

The clock signal CLK25_DUTY is a result of the AND logic operation performed by the first logic circuit 134a on the clock signals CLK0 and CLK90. Since the phase of the clock signal CLK0 is different from the phase of the clock signal CLK90, the pulse width of the clock signal CLK25_DUTY is less than the pulse width of the clock signal CLK0 and the pulse width of the clock signal CLK90. The filtered signal 131 is a result of an AND logic operation performed by the second logic circuit 136a on the clock signal CLK25_DUTY and the latch signal 112. The filtered signal 131 may include a pulse P2 corresponding to pulse P1 of the phase state signal 111, and the pulse width of the pulse P2 of the filtered signal 131 is less than the pulse width of the pulse P1 of the phase state signal 111. Referring to FIG. 1, FIG. 3A and FIG. 3B, the pulse filter 130 may adjust the pulse width of the phase state signal 111 to generate the filtered signal 131 according to the capacitance of the loop capacitor CAP. The pulse width of the filtered signal 131 may control the charging time or discharging time of the loop capacitor CAP. As such, the pulse filter 130 may adjust the charging time or discharging time of the loop capacitor CAP based on the capacitance of the loop capacitor CAP. In this way, the size the loop capacitor CAP of the loop filter 170 may be reduced without impacting the stability and the performance of the CDR device 100.

Figure 4A:
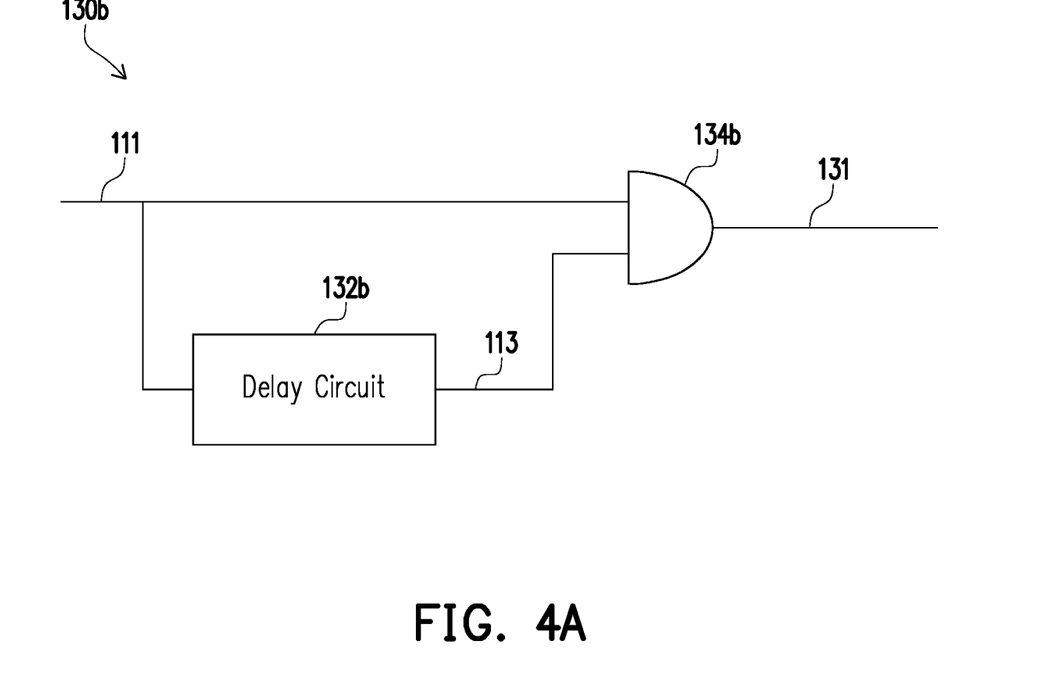
FIG. 4A and FIG. 4B illustrate a schematic diagram of a pulse filter of the CDR device in accordance with some embodiments.

FIG. 4A illustrates a schematic diagram of a pulse filter 130b in accordance with some embodiments. The pulse filter 130b in FIG. 4A may be same as the pulse filter 130 of the CDR device 100 in FIG. 1. In some embodiments, the pulse filter 130b includes a delay circuit 132b and a logic circuit 134b. The delay circuit 132b receives the phase state signal 111 and is configured to delay the phase state signal 111 to generate a delay signal 113. The logic circuit 134b receives the phase state signal 111 and the delay signal 113, and the logic circuit 134b is configured to perform a logic operation on the phase state signal 111 and the delay signal 113 to generate the filtered signal 131. In some embodiments, the logic circuit 134b is an AND logic gate that performs the AND logic operation on the phase state signal 111 and the delay signal 113 to generate the filtered signal 131.

Figure 4B:
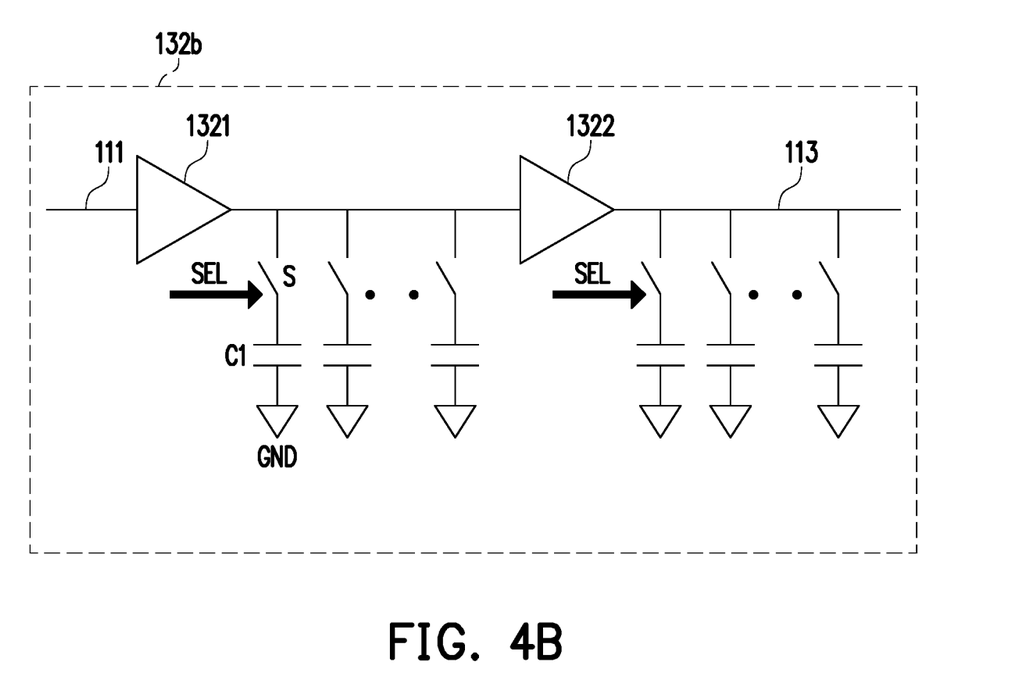

FIG. 4B illustrates a schematic diagram of the delay circuit 132b in FIG. 4A in accordance with some embodiments. The delay circuit 132b may include delay buffer circuits 1321, 1322, a plurality of capacitors C1 and a plurality of switches S. The delay buffer circuits 1321 and 1322 form an electrical path that delays the phase state signal 111 for a delay period to generate the delay signal 113. Each capacitor C1 corresponds to one of the switches S, and each capacitor C1 is coupled in series to the corresponding switch S. Each pair of the capacitor C1 and switch S is coupled to the electrical path and is configured to further delay the phase state signal 111 according to the selection signal SEL. For example, when a switch S is switched on by a corresponding selection signal SEL, the capacitor C1 corresponding to the switch S is charged, and the charging time of the capacitor C1 adds more delay to the phase state signal 111. The delay circuit 132b is also referred to as a programmable delay circuit, because the amount of delay is controllable by the selection signal SEL.

Figure 4C:
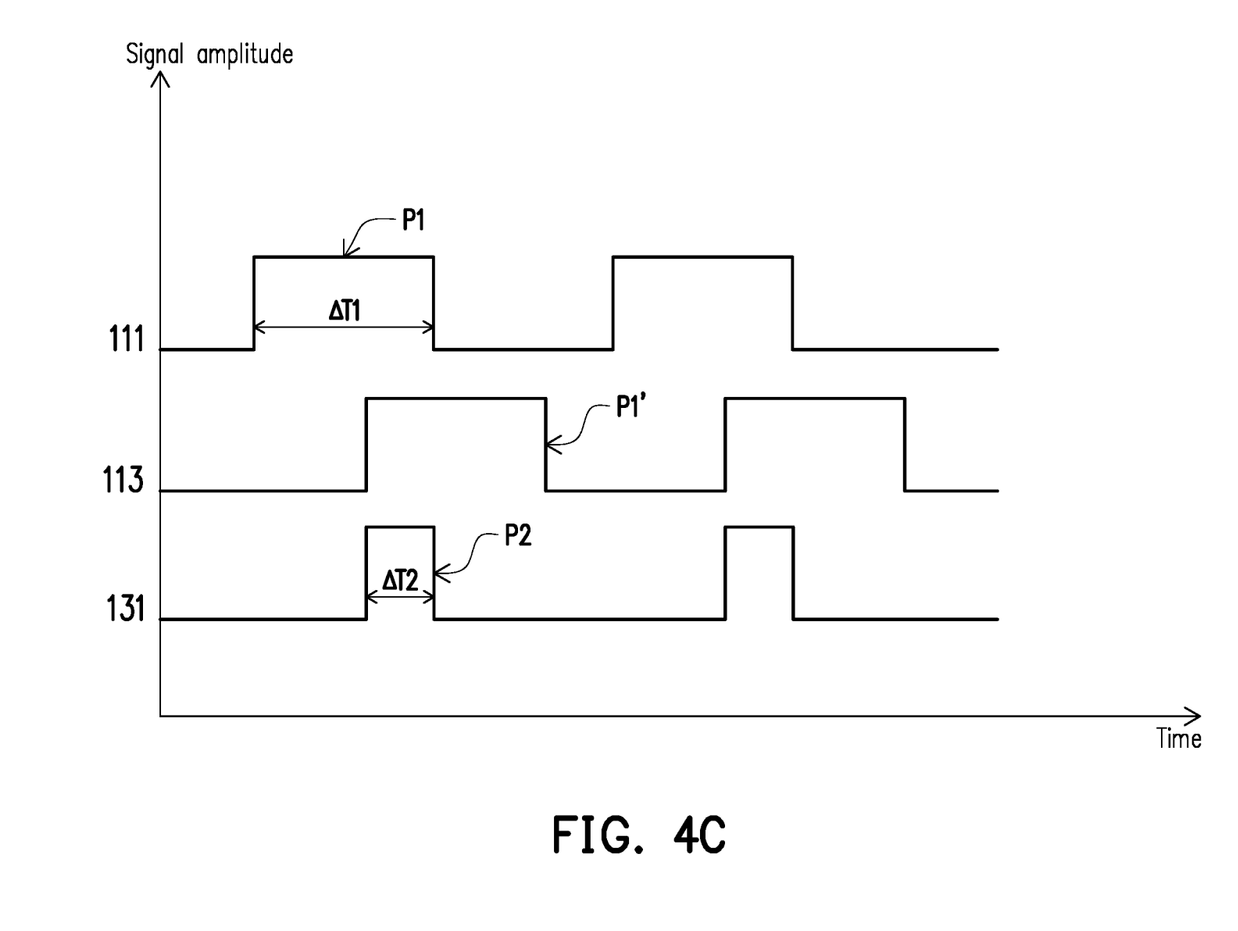
FIG. 4C illustrates a waveform diagram of signals of the pulse filter of the CDR device in accordance with some embodiments.

FIG. 4C illustrates a waveform diagram of the phase state signal 111, the delay signal 113 and the filtered signal 131 of the pulse filter 130b in accordance with some embodiments. The phase state signal 111 may include a pulse P1 with a pulse width ΔT1. Referring to FIG. 4A and FIG. 4C, the pulse P1 of the phase state signal 111 is delayed by the delay circuit 132b to be pulse P1' of the delay signal 113. The pulse P2 of the filtered signal 131 is a result of an AND logic operation performed by the logic circuit 134b on the pulse P1 of the phase state signal 111 and the pulse P1' of the delay signal 113. The pulse P2 of the filtered signal 131 has the pulse width of ΔT2. In some embodiments, the pulse width of ΔT2 of the pulse P2 of the filtered signal 131 is less than the pulse width of ΔT1 of the pulse P1 of the phase state signal 111. Referring to FIG. 1 and FIG. 4C, the pulse width of ΔT2 of the pulse P2 of the filtered signal 131 may be determined according to the capacitance of the loop capacitor CAP of the loop filter 170.

Figure 5:
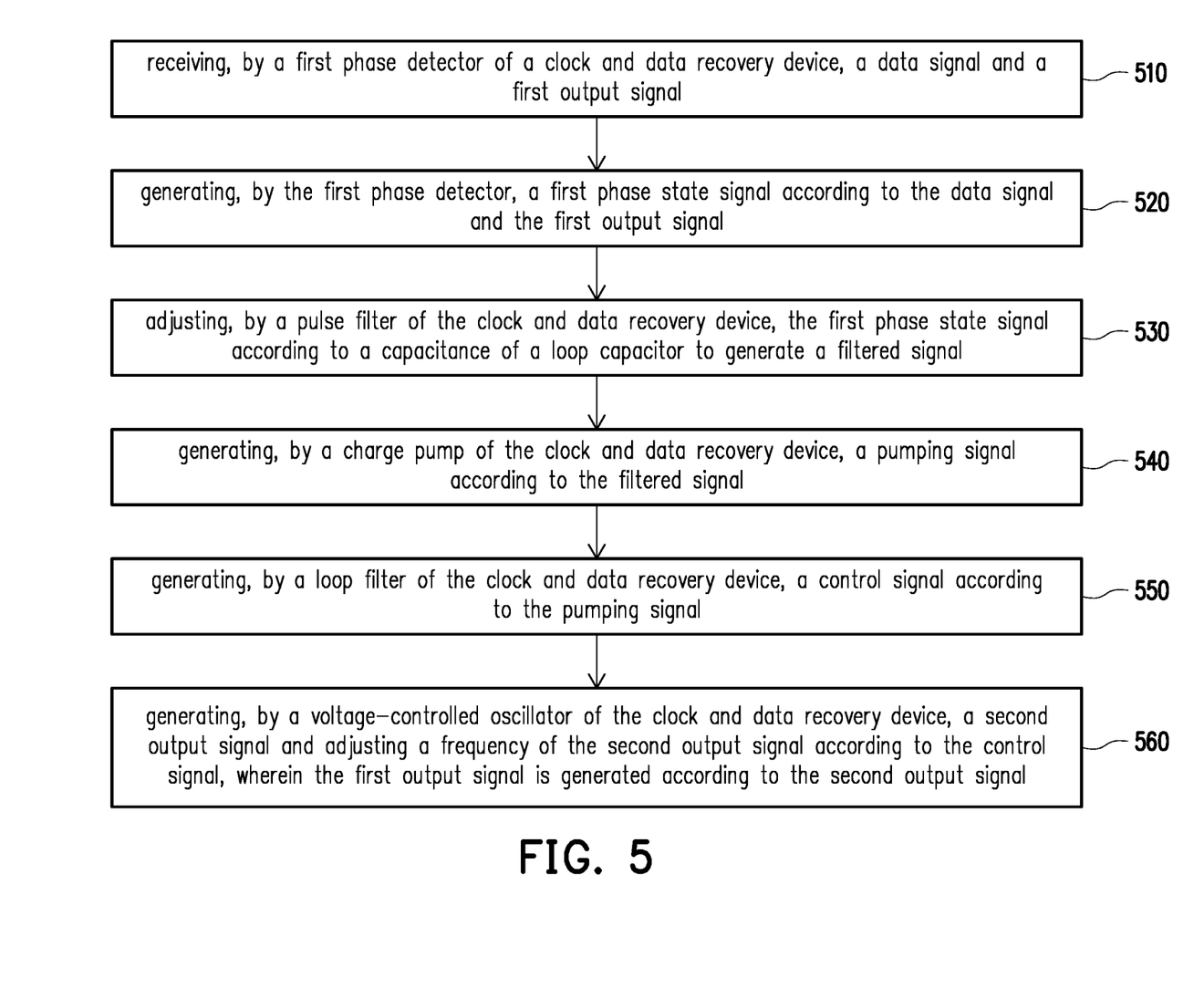
FIG. 5 illustrates a flowchart diagram of an operation method of a CDR device in accordance with some embodiments.

FIG. 5 illustrates a flowchart diagram of an operation method of a CDR device (i.e., CDR device 100 in FIG. 1) in accordance with some embodiments. The CDR device may include a first phase detector, a pulse filter, a charge pump, a loop filter and a voltage-controlled oscillator. In blocks 510 and 520, a data signal and a first output signal are received by the first phase detector, and a first phase state signal is generated by the first phase detector according to the data signal and the first output signal. In block 530, the first phase state signal is adjusted by the pulse filter according to a capacitance of a loop capacitor to generate a filtered signal. In block 540, a pumping signal is generated by the charge pump according to the filtered signal. In block 550, a control signal is generated by the loop filter according to the pumping signal. In block 560, a second output signal is generated by the voltage-controlled oscillator according to the according to the control signal. In addition, a frequency of the second output signal is adjusted according to the according to the control signal, wherein the first output signal is generated according to the second output signal.

In the above embodiments, a CDR device may include a pulse filter coupled to a phase detector of the CDR device. The pulse filter may adjust a pulse width of a phase state signal outputted from the phase detector according to a capacitance of a loop capacitor. Thus, charging time or discharging time of the loop capacitor may be adjusted according to the capacitance of the loop capacitor. In this way, the size of the loop capacitor may be reduced without degrading performance and stability of the CDR device. The circuit structure of the pulse filter is relatively simple and does not occupy much area in a circuit board, thus the overall occupied area of the CDR device is small. In addition, the circuit structure of the pulse filter is scalable, and the pulse filter of the CDR device may be enabled or disabled, so the CDR device may support wide range of data rates of the data signal.

Although the embodiment of the disclosure has been described in detail, the disclosure is not limited to a specific embodiment and various modifications and changes are possible within the scope of the disclosure disclosed in the claims.

What is claimed is:

1. A clock and data recovery device, comprising:
   a first phase detector, receiving a data signal and a first output signal, and generating a first phase state signal according to the data signal and the first output signal;
   a pulse filter, coupled to the first phase detector, adjusting a pulse width of the first phase state signal according to a capacitance of a loop capacitor to generate a filtered signal, wherein the pulse width of the pulse of the first phase state signal is positively proportional to the capacitance of the loop capacitor;
   a charge pump, coupled to the phase detector, generating a pumping signal according to the filtered signal;
   a loop filter, comprising the loop capacitor, generating a control signal according to the pumping signal; and
   a voltage-controlled oscillator, generating a second output signal and adjusting a frequency of the second output signal according to the control signal, wherein the first output signal is generated according to the second output signal.

2. The clock and data recovery device of claim 1, wherein wherein the pulse width of the pulse of the first phase state signal corresponds to a charging time or a discharging time of the loop capacitor.

3. The clock and data recovery device of claim 1, wherein the pulse filter comprises:
   a latch circuit, coupled to first phase detector, latching the first phase state signal based on a first clock signal to generate a latch signal;
   a first logic circuit, performing a first logic operation on the first clock signal and a second clock signal to generate a third clock signal; and
   a second logic circuit, coupled to the latch circuit and the first logic circuit, performing a second logic operation on the third clock signal and the latch signal to generate the filtered signal.

4. The clock and data recovery device of claim 3, wherein a phase of the first clock signal is different from a phase of the second clock signal,
   each of the first logic circuit and the second logic circuit comprises an AND logic gate.

5. The clock and data recovery device of claim 1, wherein the pulse filter comprises:
   a delay circuit, delaying the first phase state signal to generate a delay signal; and
   a logic circuit, coupled to the delay circuit, performing a logic operation on the delay signal and the first phase state signal to generate the filtered signal.

6. The clock and data recovery device of claim 1, further comprising:
   a frequency divider, coupled between the first phase detector and the voltage-controlled oscillator, receiving the second output signal from the voltage-controlled oscillator, dividing a frequency of the second output signal by a non-zero value to generate the first output signal, and outputting the first output signal to the first phase detector.

7. The clock and data recovery device of claim 1, wherein the first phase state signal indicates a phase leading state or a phase lagging state of the data signal relative to the first clock signal.

8. The clock and data recovery device of claim 1, further comprising:
   a second phase detector, receiving a reference clock signal and generating a second phase state signal according to the reference clock signal;
   a first multiplexer, selectively connecting the second phase detector or the pulse filter to the charge pump according to a lock signal; and
   a second multiplexer, selectively connecting the second phase detector or the first phase detector to the voltage-controlled oscillator according to the lock signal.

9. The clock and data recovery device of claim 8, wherein during a first operational mode of the clock and data recovery device, the first multiplexer is configured to electrically connect the second phase detector to the charge pump, and the second multiplexer is configured to electrically connect the second phase detector to the voltage-controlled oscillator, and
   during a second operational mode of the clock and data recovery device, the first multiplexer is configured to electrically connect the first phase detector to the charge pump, and the second multiplexer is configured to electrically connect the first phase detector to the voltage-controlled oscillator.

10. The clock and data recovery device of claim 9, wherein
    during the first operational mode of the clock and data recovery device, the clock and data recovery device is configured to align a frequency of the second output signal that is outputted from the voltage-controlled oscillator with a target frequency, and
    the clock and data recovery device is switched from the first operational mode to the second operation mode when the frequency of the second output signal that is outputted from the voltage-controlled oscillator is aligned with the target frequency.

11. The clock and data recovery device of claim 10, wherein
    the second phase detector is a linear phase detector, and the first phase detector is a bang-bang phase detector.

12. A clock and data recovery device, comprising:
    a first phase detector, receiving a data signal and a first output signal, and generating a first phase state signal according to the data signal and the first output signal;
    a pulse filter, coupled to the first phase detector, adjusting the first phase state signal according to a capacitance of a loop capacitor to generate a filtered signal;
    a second phase detector, receiving a reference clock signal and generating a second phase state signal according to the reference clock signal;
    a first multiplexer, selecting the second phase detector or the pulse filter according to a lock signal;
    a second multiplexer, selecting the first phase detector or the second phase detector according to the lock signal;

a charge pump, coupled to the first multiplexer, generating a pumping signal according to the second signal or the third pulse signal;

a loop filter, comprising the loop capacitor, generating a control signal according to the pumping signal; and a voltage-controlled oscillator, generating a second output signal and adjusting a frequency of the second output signal according to the control signal, wherein the first output signal is generated according to the second output signal.

13. The clock and data recovery device of claim 12, wherein the pulse filter is configured to adjust a pulse width of a pulse of the first phase state signal according to the capacitance of the loop capacitor, and the pulse width of the pulse of the first phase state signal is positively proportional to the capacitance of the loop capacitor.

14. The clock and data recovery device of claim 13, wherein wherein the pulse width of the pulse of the first phase state signal corresponds to a charging time or a discharging time of the loop capacitor.

15. The clock and data recovery device of claim 12, wherein the pulse filter comprises:

a latch circuit, coupled to first phase detector, latching the first phase state signal based on a first clock signal to generate a latch signal;

a first logic circuit, performing a first logic operation on the first clock signal and a second clock signal to generate a third clock signal; and a second logic circuit, coupled to the latch circuit and the first logic circuit, performing a second logic operation on the third clock signal and the latch signal to generate the filtered signal, wherein a phase of the first clock signal is different from a phase of the second clock signal, each of the first logic circuit and the second logic circuit comprises an AND logic gate.

16. The clock and data recovery device of claim 12, wherein the pulse filter comprises:

a delay circuit, delaying the first phase state signal to generate a delay signal; and a logic circuit, coupled to the delay circuit, performing a logic operation on the delay signal and the first phase state signal to generate the filtered signal.

17. The clock and data recovery device of claim 12, wherein during a first operational mode of the clock and data recovery device, the first multiplexer is configured to electrically connect the second phase detector to the charge pump, the second multiplexer is configured to electrically connect the second phase detector to the voltage-controlled oscillator, and during a second operational mode of the clock and data recovery device, the first multiplexer is configured to electrically connect the first phase detector to the charge pump, the second multiplexer is configured to electrically connect the first phase detector to the voltage-controlled oscillator.

18. The clock and data recovery device of claim 17, wherein during the first operational mode of the clock and data recovery device, the clock and data recovery device is configured to align a frequency of the second output signal that is outputted from the voltage-controlled oscillator with a target frequency, and the clock and data recovery device is switched from the first operational mode to the second operation mod when the frequency of the second output signal that is outputted from the voltage-controlled oscillator is aligned with the target frequency.

19. An operation method of a clock and data recovery device, wherein the clock and data recovery device comprises a first phase detector, a pulse filter, a charge pump and a voltage-controlled oscillator, the operation method comprising:

receiving, by the first phase detector, a data signal and a first output signal;

generating, by the first phase detector, a first phase state signal according to the data signal and the first output signal;

adjusting, by the pulse filter, a pulse width of the first phase state signal according to a capacitance of a loop capacitor to generate a filtered signal, wherein the pulse width of the pulse of the first phase state signal is positively proportional to the capacitance of the loop capacitor;

generating, by the charge pump, a pumping signal according to the filtered signal;

generating, by the loop filter, a control signal according to the pumping signal; and generating, by the voltage-controlled oscillator, a second output signal and adjusting a frequency of the second output signal according to the control signal, wherein the first output signal is generated according to the second output signal.

\* \* \* \* \*